US008203901B2

(12) United States Patent
Jeddeloh

(10) Patent No.: US 8,203,901 B2
(45) Date of Patent: *Jun. 19, 2012

(54) CONFIGURABLE BANDWIDTH MEMORY DEVICES AND METHODS

(75) Inventor: Joe M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/179,196

(22) Filed: Jul. 8, 2011

(65) Prior Publication Data

US 2011/0267865 A1 Nov. 3, 2011

Related U.S. Application Data

(63) Continuation of application No. 12/408,906, filed on Mar. 23, 2009, now Pat. No. 8,018,752.

(51) Int. Cl.
*G11C 7/00* (2006.01)
(52) U.S. Cl. ............... 365/222; 365/201; 365/230.06
(58) Field of Classification Search .......... 365/51, 365/63, 189.05, 163, 191
See application file for complete search history.

(56) References Cited

U.S. PATENT DOCUMENTS

| 7,402,897 | B2 | 7/2008 | Leedy | |
| 7,929,368 | B2* | 4/2011 | Jeddeloh | 365/222 |
| 7,978,721 | B2* | 7/2011 | Jeddeloh et al. | 370/419 |
| 8,018,752 | B2* | 9/2011 | Jeddeloh | 365/51 |
| 2004/0262772 | A1 | 12/2004 | Ramanathan et al. | |
| 2006/0126369 | A1 | 6/2006 | Raghuram | |
| 2008/0084725 | A1 | 4/2008 | Lahtinen et al. | |
| 2008/0103753 | A1* | 5/2008 | Rajan et al. | 703/23 |
| 2008/0130395 | A1 | 6/2008 | Silvestri | |
| 2010/0085825 | A1 | 4/2010 | Keeth et al. | |
| 2010/0088460 | A1 | 4/2010 | Jeddeloh | |
| 2010/0091537 | A1* | 4/2010 | Best et al. | 365/51 |
| 2010/0180150 | A1* | 7/2010 | Jeddeloh | 714/5 |
| 2010/0191999 | A1 | 7/2010 | Jeddeloh | |
| 2010/0192041 | A1 | 7/2010 | Jeddeloh | |
| 2010/0195421 | A1* | 8/2010 | Jeddeloh | 365/193 |
| 2010/0211745 | A1* | 8/2010 | Jeddeloh | 711/137 |
| 2010/0238693 | A1 | 9/2010 | Jeddeloh | |
| 2011/0194369 | A1* | 8/2011 | Jeddeloh | 365/222 |

FOREIGN PATENT DOCUMENTS

| WO | WO-2010111281 A2 | 9/2010 |
| WO | WO-2010111281 A3 | 1/2011 |

OTHER PUBLICATIONS

"International Application Serial No. PCT/US2010/028335, International Preliminary Report on Patentability mailed Oct. 6, 2011", 6 pgs.

* cited by examiner

*Primary Examiner* — Gene Auduong
(74) *Attorney, Agent, or Firm* — Schwegman, Lundberg & Woessner, P.A.

(57) ABSTRACT

Memory devices and methods are described, such as those that include a stack of memory dies and an attached logic die. Method and devices described provide for configuring bandwidth for selected portions of a stack of memory dies. Additional devices, systems, and methods are disclosed.

17 Claims, 5 Drawing Sheets

CONFIGURABLE BANDWIDTH MEMORY DEVICES AND METHODS

PRIORITY APPLICATION

This application is a continuation of U.S. application Ser. No. 12/408,906, filed Mar. 23, 2009 now U.S. Pat. No. 8,018,752, which is incorporated herein by reference in its entirety.

TECHNICAL FIELD

Various embodiments described herein relate to apparatus, systems, and methods associated with semiconductor memories.

BACKGROUND

Microprocessor technology has evolved at a faster rate than that of semiconductor memory technology. As a result, a mis-match in performance often exists between the modern host processor and the semiconductor memory subsystem to which the processor is mated to receive instructions and data. For example, it is estimated that some high-end servers idle three out of four clock cycles waiting for responses to memory requests.

In addition, the evolution of software application and operating system technology has increased demand for higher-density memory subsystems as the number of processor cores and threads continues to increase. However, current-technology memory subsystems often represent a compromise between performance and density. Higher bandwidths may limit the number of memory cards or modules that may be connected in a system without exceeding Joint Electron Device Engineering Council (JEDEC) electrical specifications.

Extensions to JEDEC interface standards such as dual data rate (DDR) synchronous dynamic random access memory (SDRAM) have been proposed but may be generally found lacking as to future anticipated memory bandwidths and densities. Weaknesses include lack of memory power optimization and the uniqueness of the interface between the host processor and the memory subsystem. The latter weakness may result in a need to redesign the interface as processor and/or memory technologies change.

DETAILED DESCRIPTION

In the following detailed description of the invention, reference is made to the accompanying drawings that form a part hereof and in which is shown, by way of illustration, specific embodiments in which the invention may be practiced. These embodiments are described in sufficient detail to enable those skilled in the art to practice the invention. Other embodiments may be utilized and structural, logical, and electrical changes may be made.

Figure 1:
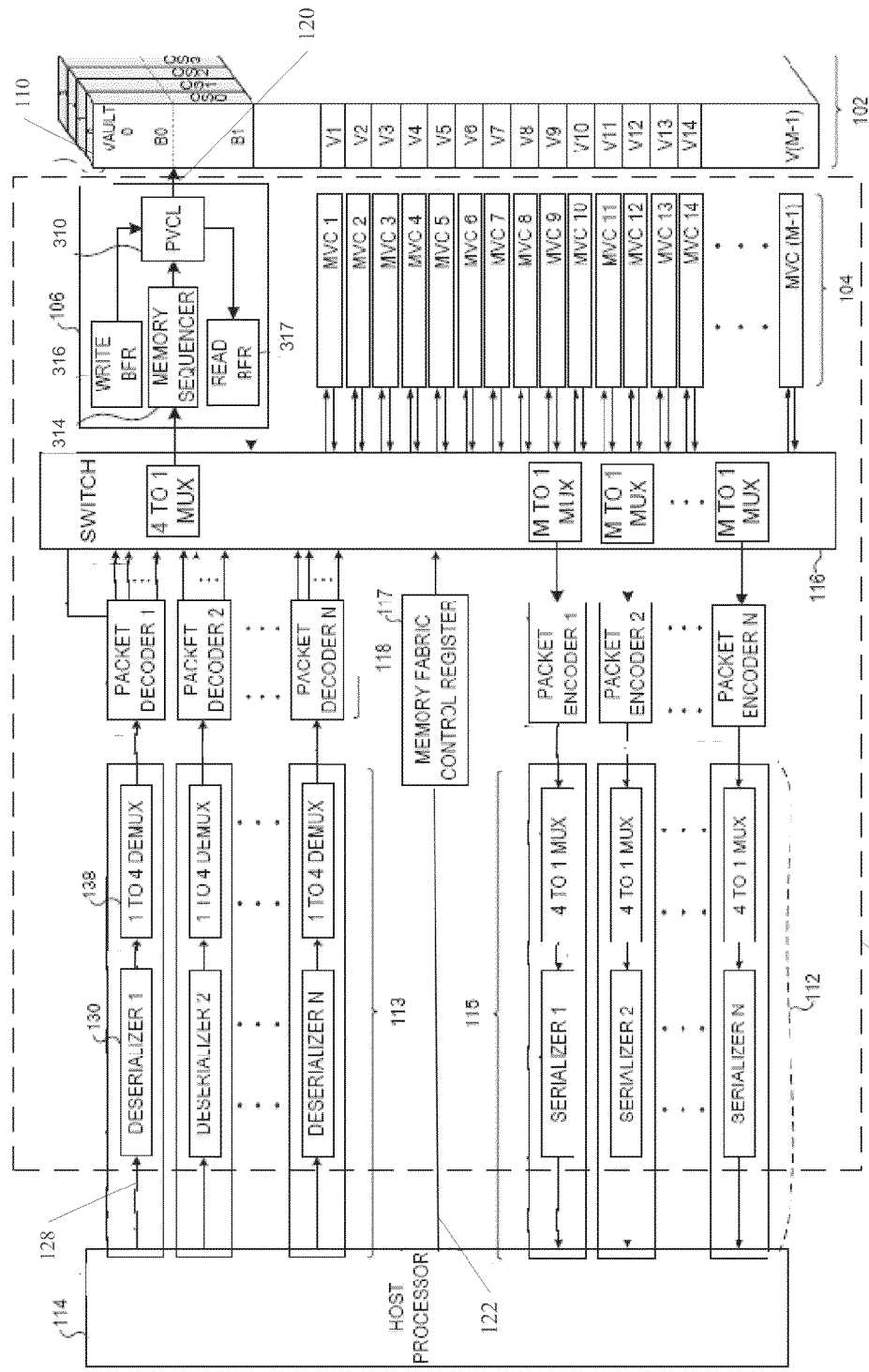
FIG. 1 shows a block diagram of a memory system according to an embodiment of the invention.

FIG. 1 includes a block diagram of a memory device 100 according to various example embodiments of the current invention. The memory device 100 operates to substantially concurrently transfer a plurality of outbound and/or inbound streams of commands, addresses, and/or data between one or more originating devices and/or destination devices (e.g., a host, such as one comprising one or more processors) and a set of stacked-array memory "vaults" 110. Increased memory system density, bandwidth, parallelism, and scalability may result.

Multi-die memory array embodiments aggregate control logic that is normally located on each individual memory array die in previous designs. Subsections of a stacked group of dies, referred to in the present disclosure as memory vaults are shown as example vault 110 in FIG. 1 and as example vault 230 in FIG. 2. The memory vaults shown in the illustrated examples share common control logic. The memory vault architecture strategically partitions memory control logic to increase energy efficiency while providing a finer granularity of powered-on memory banks. Embodiments shown also enable a standardized host processor to memory system interface. The standardized interface may reduce re-design cycle times as memory technology evolves.

Figure 2:
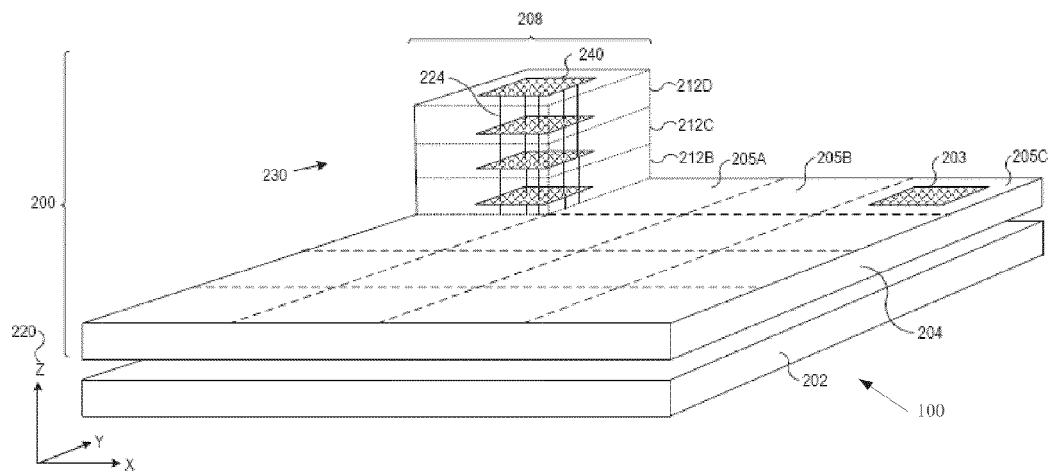
FIG. 2 shows a cut-away conceptual view of a stacked-die 3D memory with a logic die according to an embodiment of the invention.

FIG. 2 is a cut-away conceptual view of a stacked-die 3D memory array 200 stacked with a logic die 202 to form a memory device 100 according to various example embodiments. The memory device 100 incorporates one or more stacks of memory arrays 203 resulting in the stacked-die 3D memory array 200. Multiple memory arrays (e.g., the memory array 203) are fabricated onto each of a plurality of dies (e.g., the die 204). The memory array dies are then stacked to form the stacked-die 3D memory array 200.

Each die of the stack is divided into multiple "tiles" (e.g., the tiles 205A, 205B, and 205C associated with the stacked die 204). Each tile (e.g., the tile 205C) may include one or more memory arrays 203. The memory arrays 203 are not limited to any particular memory technology and may include dynamic random-access memory (DRAM), static random access memory (SRAM), flash memory, etc.

A stacked set of memory array tiles 208 may include a single tile from each of the stacked dies (e.g., the tiles 212B, 212C and 212D, with the base tile hidden from view in FIG. 1). Power, address, and/or data and similar common signals may traverse the stacked set of tiles 208 in the "Z" dimension 220 on conductive paths (e.g., the conductive path 224) such as "through-wafer interconnects" (TWIs). It is noted that a TWI need not necessarily pass entirely through a particular wafer or die.

The stacked-die 3D memory array 200 in one configuration is partitioned into a set of memory "vaults" (e.g., the memory vault 230). Each memory vault includes a stacked set of tiles (e.g., the set of tiles 208), one tile from each of a plurality of stacked dies, together with a set of TWIs to electrically interconnect the set of tiles 208. Each tile of the vault includes one or more memory arrays (e.g., the memory array 240). Although partitions into individual vaults 230 are described, the 3D memory array 200 can be partitioned in a number of other ways also. Other example partitions include partitioning by dies, tiles, etc.

A set of memory vaults 102, similar to the memory vaults 230 from FIG. 2, is illustrated in FIG. 1 in context within the memory device 100. The memory device 100 also includes a plurality 104 of memory vault controllers (MVCs) (e.g., the MVC 106). Each MVC is communicatively coupled to a corresponding memory vault (e.g., the memory vault 110 of the set 102) in a one-to-one relationship. Each MVC is thus capable of communicating with a corresponding memory vault independently from communications between other MVCs and their respective memory vaults.

The memory device 100 also includes a plurality of configurable serialized communication link interfaces (SCLIs) 112. The SCLIs 112 are divided into an outbound group of SCLIs 113 and an inbound group of SCLIs 115, where "outbound" and "inbound" directions are defined from the perspective of the processor(s) 114. Each SCLI of the plurality of SCLIs 112 is capable of concurrent operation with the other SCLIs. Together the SCLIs 112 communicatively couple the plurality of MVCs 104 to one or more processor(s) 114. The memory device 100 presents a multi-link, high-throughput interface to the host processor(s) 114.

The memory device 100 may also include a switch 116. In some embodiments, the switch 116 may comprise a matrix switch which might also be referred to as a cross connect switch. The switch 116 is communicatively coupled to the plurality of SCLIs 112 and to the plurality of MVCs 104. The switch 116 is capable of cross-connecting directly to each SCLI to a selected MVC. The host processor(s) 114 may thus access the plurality of memory vaults 102 across the plurality of SCLIs 112 in a substantially simultaneous fashion. This architecture can provide high processor-to-memory bandwidth for modern processor technologies, including multi-core technologies.

The memory device 100 may also include a memory fabric control register 117 coupled to the switch 116. The memory fabric control register 117 accepts memory fabric configuration parameters from a configuration source and configures one or more components of the memory device 100 to operate according to a selectable mode. For example, the switch 116 and each of the plurality of memory vaults 102 and the plurality of MVCs 104 may normally be configured to operate independently of each other in response to separate memory requests. Such a configuration can enhance memory system bandwidth as a result of the parallelism between the SCLIs 112 and the memory vaults 102.

Alternatively, the memory device 100 may be reconfigured via the memory fabric control register 117 to cause a subset of two or more of the plurality of memory vaults 102 and a corresponding subset of MVCs to operate synchronously in response to a single request. The latter configuration may be used to access a data word that is wider than the width of a data word associated with a single vault. Such a word is herein referred to as a wide data word. This technique may decrease latency. Other configurations may be enabled by loading a selected bit pattern into the memory fabric control register 117.

In one example the outbound SCLIs 113 may include a plurality of outbound differential pair serial paths (DPSPs) 128. The DPSPs 128 are communicatively coupled to the host processor(s) 114 and may collectively transport an outbound packet. The outbound SCLI 113 may also include a deserializer 130 coupled to the plurality of outbound DPSPs 128. The outbound SCLI may also include a demultiplexer 138 communicatively coupled to the deserializer 130. In one embodiment, the configuration of DSPSs, deserializers, and demultiplexers facilitates efficient transfer of data packets or sub-packets. Similar to the outbound SLCIs, in one embodiment, the inbound SCLIs and a similar configuration of DSPSs, serializers, and multiplexers facilitate efficient transfer of data packets or sub-packets.

Figure 3:
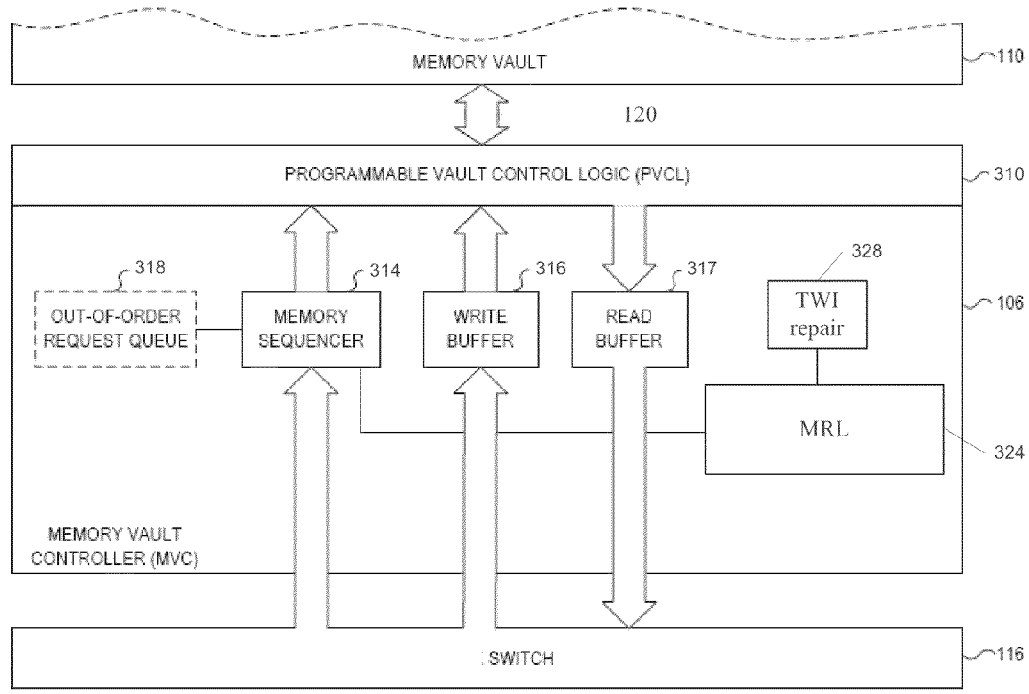
FIG. 3 shows a block diagram of a memory vault controller and associated modules according to an embodiment of the invention.

FIG. 3 is a block diagram of an MVC (e.g., the MVC 106) and associated modules according to various example embodiments. The MVC 106 may include a programmable vault control logic (PVCL) component 310. The PVCL 310 interfaces the MVC 106 to the corresponding memory vault (e.g., the memory vault 110). The PVCL 310 generates one or more control signals and/or timing signals associated with the corresponding memory vault 110.

The PVCL 310 may be configured to adapt the MVC 106 to a memory vault 110 of a selected configuration or a selected technology. Thus, for example, the memory device 100 may initially be configured using currently-available DDR2 DRAMs. The memory device 100 may subsequently be adapted to accommodate DDR3-based memory vault technology by reconfiguring the PVCL 310 to include DDR3 bank control and timing logic.

The MVC 106 includes a memory sequencer 314 communicatively coupled to the PVCL 310. The memory sequencer 314 performs a memory technology dependent set of operations based upon the technology used to implement the associated memory vault 110. The memory sequencer 314 may, for example, perform command decode operations, memory address multiplexing operations, memory address demultiplexing operations, memory refresh operations, memory vault training operations, and/or memory vault prefetch operations associated with the corresponding memory vault 110. In some embodiments, the memory sequencer 314 may comprise a DRAM sequencer. In some embodiments, memory refresh operations may originate in a separate refresh controller (not shown).

The memory sequencer 314 may be configured to adapt the memory device 100 to a memory vault 110 of a selected configuration or technology. For example, the memory sequencer 314 may be configured to operate synchronously with other memory sequencers associated with the memory device 100. Such a configuration may be used to deliver a wide data word from multiple memory vaults to a cache line (not shown) associated with the host processor(s) 114 in response to a single cache line request.

The MVC 106 may also include a write buffer 316. The write buffer 316 may be coupled to the PVCL 310 to buffer data arriving at the MVC 106 from the host processor(s) 114. The MVC 106 may further include a read buffer 317. The read buffer 317 may be coupled to the PVCL 310 to buffer data arriving at the MVC 106 from the corresponding memory vault 110.

The MVC 106 may also include an out-of-order request queue 318. The out-of-order request queue 318 establishes an ordered sequence of read and/or write operations to the plurality of memory banks included in the memory vault 110. The ordered sequence is chosen to avoid sequential operations to any single memory bank in order to reduce bank conflicts and to decrease read-to-write turnaround time.

The MVC 106 may also include a memory repair logic (MRL) component 324. The MRL 324 can manage a number of operations such as TWI repair operations using TWI repair logic 328, or other repair operations.

Figure 4:
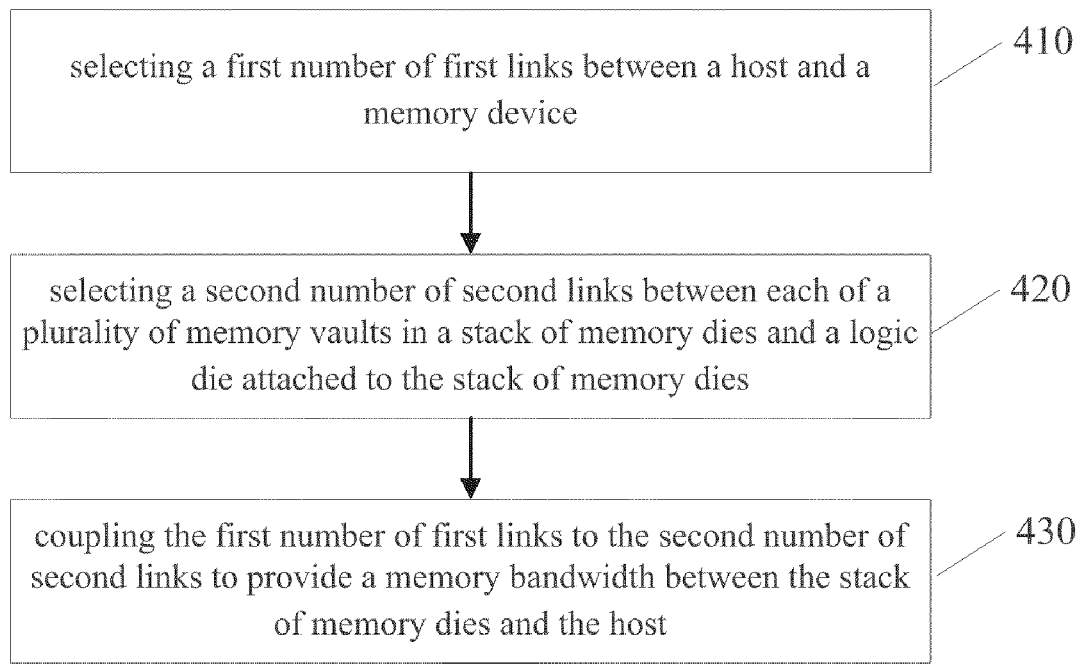
FIG. 4 shows a method of operating a memory device according to an embodiment of the invention.

FIG. 4 illustrates a method of operation according to an embodiment of the invention. In operation 410, a first number of first links coupled to a host are selected. An example of first links includes SCLIs 112 as described above. Each first link has an individual bandwidth. When a first number of first links are selected to operate together, the bandwidth of the combined first links is increased.

In operation 420, a second number of second links coupled to respective memory vaults in the plurality of memory vaults of the stack are selected. An example of second links includes links 120 as illustrated in FIG. 1. In the FIG. 1 example, the second links 120 couple respective ones of the MVC's 104 to each associated memory vault 102 in the stacked-die 3D memory array 200. Although memory vaults are recited as portions of the stacked-die 3D memory array 200, other portions such as dies 204, tiles 205, etc. are possible.

In operation 430, the selected first number of first links and the selected second number of second links are coupled together to provide a memory bandwidth between the stack of memory dies and the host. Again using FIG. 1 as an example, a selected number of first links 112 and a selected number of second links 120 are coupled to provide a memory bandwidth between the stacked-die 3D memory array 200 and the host 114.

Example embodiments include coupling one first link 112 to multiple second links 120 to provide access to multiple vaults 110 in parallel. Another example embodiment includes coupling one second link 120 to multiple first links 112 to provide more bandwidth from a single given vault 110 than available with only a single first link 112. Other examples include combinations of multiple first links 112 and second links 120 to provide a number of bandwidth combinations both in terms of multiple vaults 110, and multiple first links 112.

A switch 116 is shown in FIG. 1 that is used to couple the number of first links 112 to the number of second links 120. In one example, the switch 116 is a dynamic link controller that is able to vary memory bandwidth to portions of the stacked-die 3D memory array 200 during memory operation. An example of a dynamic link controller includes a crossbar switch that directly connects any first link or links to any second link or links. In another example, the dynamic link controller includes one local direct connection between a first link and a second link, with a plurality of buffered connections between a given first link and other remote second links. This example embodiment is described in more detail with respect to FIG. 5 below.

In another example, switch 116 is a static controller that sets memory bandwidth to portions of the stacked-die 3D memory array 200 once at manufacture, or once at device startup. In an example static configuration, a link configuration register such as the memory fabric control register 117 is used to configure the bandwidth once at manufacture, upon startup, or another event such as device reset.

In one example, a desired configuration, such as a static configuration or a dynamic configuration as described above, is sent from the host 114 through a path 122 to the memory fabric control register 117. In one embodiment, the desired configuration is sent from a memory map. In a memory map configuration, regions of memory address space can be mapped to be serviced by one or multiple vaults. In selected examples the memory map can be located on the logic chip 202, in the host 114 as described above, or other locations external to the memory device 100.

Memory devices and systems as described above can be configured to match bandwidth to various types of memory operations. For example, multiple links can be combined to provide one wide bandwidth path, or links can be divided up to create a larger number of smaller bandwidth paths. In one application, smaller bandwidth paths are used to conserve power, while in another application wider bandwidth paths are used to provide speed.

In one example, multiple links are combined to dynamically provide a write bandwidth that is different from a read bandwidth. Commonly, read operations take different amounts of time from write operations in a memory system. By combining links to vary bandwidth from a write to a read operation, a speed of a write operation can be adjusted to substantially match a speed of a read operation. In one embodiment, a read to write ratio of operation speed in a given memory device is determined. In one embodiment, the read to write ratio is then stored in a register, and during device operation, bandwidth is varied between read operations and write operations based on the value stored in the register. In one example, the register is located on the memory device 100 such as in the logic die as described in embodiments above. Other methods to keep track of the read to write ratio are also possible, such as storing the ratio within the host 114, or in a register at a different location.

Figure 5:
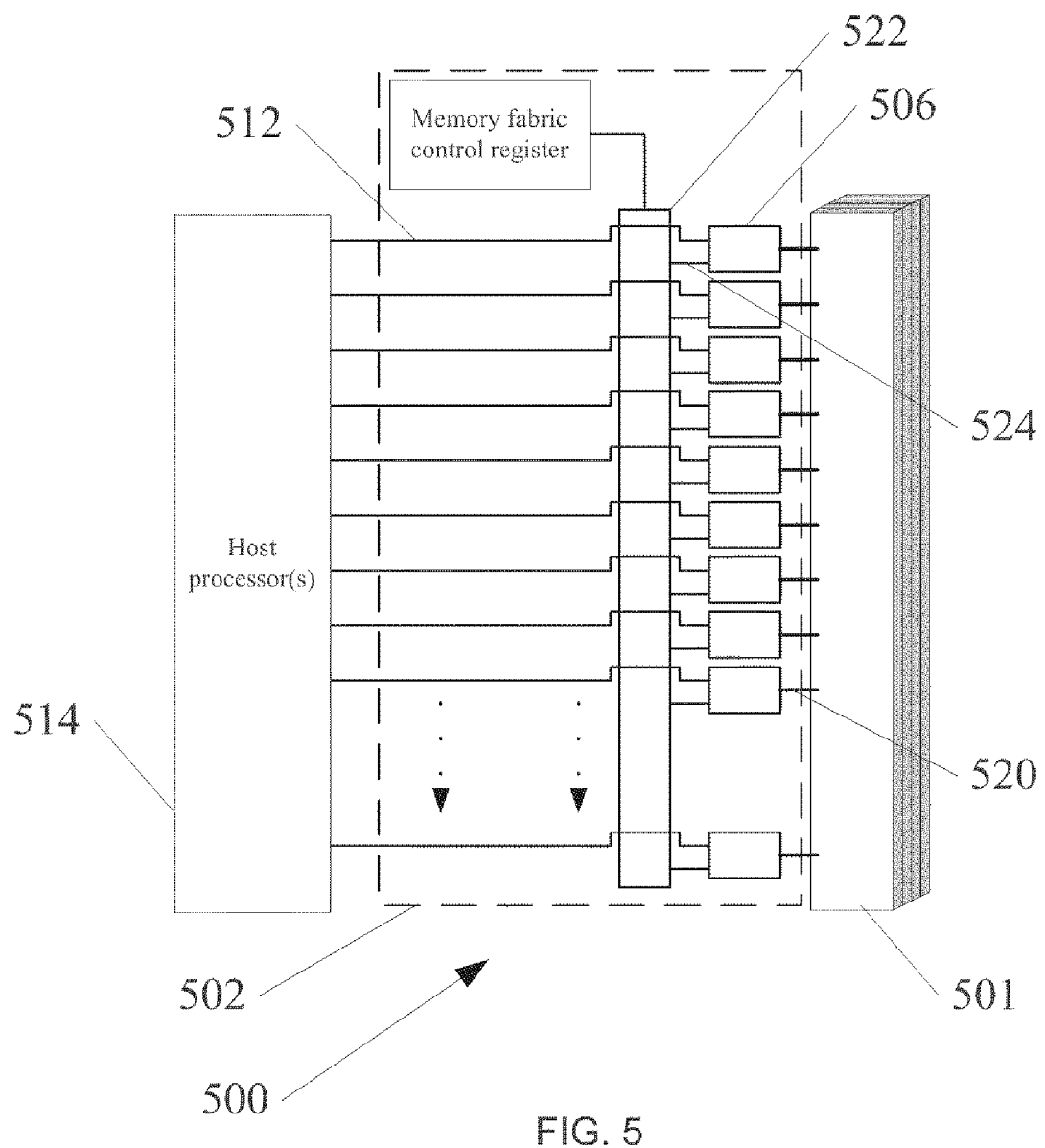
FIG. 5 shows a block diagram of another memory system according to an embodiment of the invention.

FIG. 5 shows an example of another memory device 500. A host 514 is shown coupled to the memory device 500 by a number of first links 512. A stacked-die 3D memory array 501, similar to embodiments above, is shown coupled to a logic die 502 by a number of second links 520. In the embodiment of FIG. 5, each first link 512 includes one direct connection to a portion of the stacked-die 3D memory array 501, such as a memory vault. Each first link 512 can also be selectively coupled to any other portion such as a vault through a dynamic link controller 522 that buffers information exchange to remote memory portions such as vaults. Each buffered connection 524 is shown coupling between the dynamic link controller 522 and a local switch such as an MVC 506 similar to embodiments described above.

Embodiments with both direct local connections and buffered remote connections provide fast local access, while also providing power savings over examples such as a full crossbar link controller. Power savings are facilitated as a result of the buffer operation to remote vaults or other memory portions.

The apparatus and systems of various embodiments may be useful in applications other than a high-density, multi-link, high-throughput semiconductor memory subsystem. Thus, various embodiments of the invention are not so limited. The illustrations of the memory device 100 are intended to provide a general understanding of the structure of various embodiments. They are not intended to serve as a complete description of all the elements and features of apparatus and systems that can use the structures described herein.

As discussed above, systems are described in the present disclosure that include 3D memory devices and processors. Examples of such systems, include, but are not limited to televisions, cellular telephones, personal data assistants (PDAs), personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Figure 6:
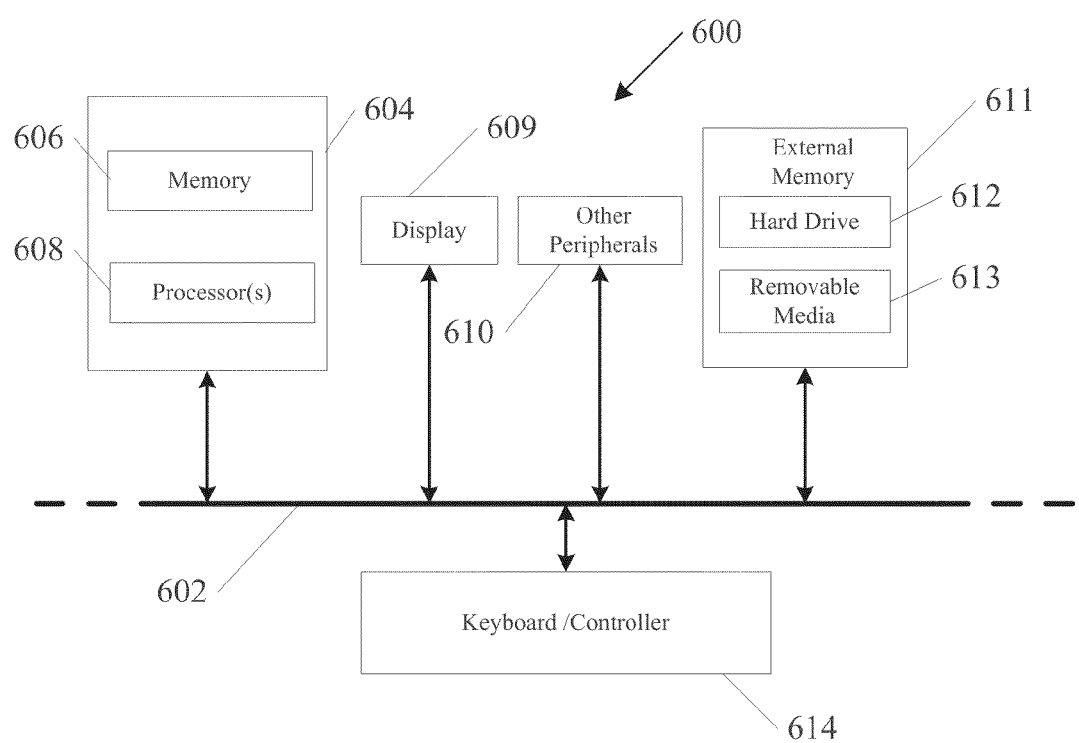
FIG. 6 shows a block diagram of an information handling system according to an embodiment of the invention.

A high level example of a personal computer is included in FIG. 6 to show one possible higher level device application for the present invention. FIG. 6 is a block diagram of an information handling system 600 incorporating at least one memory device 606 according to an embodiment of the invention.

In this example, information handling system 600 comprises a data processing system that includes a system bus 602 to couple the various components of the system. System bus 602 provides communications links among the various components of the information handling system 600 and may be implemented as a single bus, as a combination of busses, or in any other suitable manner.

Chip assembly 604 is coupled to the system bus 602. Chip assembly 604 may include any circuit or operably compatible combination of circuits. In one embodiment, chip assembly 604 includes a processor 608 or multiple processors that can be of any type. As used herein, "processor" means any type of computational circuit such as, but not limited to, a microprocessor, a microcontroller, a graphics processor, a digital signal processor (DSP), or any other type of processor or processing circuit. As used herein, "processor" includes multiple processors or multiple processor cores.

In one embodiment, a memory device 606 is included in the chip assembly 604. A memory device such as a DRAM is one example of such a memory device 606. One example of a DRAM device includes a stacked memory chip 3D memory device with an integrated logic chip as described in embodiments above. Memory 606 can also include non-volatile memory such as flash memory.

Information handling system 600 may also include an external memory 611, which in turn can include one or more memory elements suitable to the particular application, such as one or more hard drives 612, and/or one or more drives that handle removable media 613 such as flash memory drives, compact disks (CDs), digital video disks (DVDs), and the like.

Information handling system 600 may also include a display device 509 such as a monitor, additional peripheral components 610, such as speakers, etc. and a keyboard and/or controller 614, which can include a mouse, trackball, game controller, voice-recognition device, or any other device that permits a system user to input information into and receive information from the information handling system 600.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon reviewing the above description.

What is claimed is:

1. A memory device, comprising:
   a stack of memory dies, including a number of memory vaults;
   a logic die stacked with the stack of memory dies;
   a memory fabric control register selectably coupled to the number of memory vaults to select a number of vaults that operate synchronously for a single memory request.

2. The memory device of claim 1, further including one local direct connection between an external device and a first memory vault, and a buffered connection between the external device and a second memory vault.

3. The memory device of claim 1, further including one local direct connection between an external device and a first memory vault, and a buffered connection between the external device and a plurality of second memory vaults.

4. The memory device of claim 1, further including a number of vault controllers, wherein each vault controller is coupled directly to a first vault, and connected to a plurality of second memory vaults through a buffered connection.

5. The memory device of claim 1, wherein the memory fabric control register is located on the logic die.

6. An apparatus, comprising:
   a stack of memory dies, including a number of memory vaults;
   a logic die stacked with the stack of memory dies;
   a switch selectably coupled to the number of memory vaults to select a number of vaults that operate synchronously for a single memory request.

7. The apparatus of claim 6, further including a processor coupled to the memory device.

8. The apparatus of claim 7, wherein the processor and the memory device are located on the same chip assembly.

9. The apparatus of claim 6, wherein the switch is adapted to configure bandwidth in the memory device at manufacture.

10. The apparatus of claim 6, wherein the switch is adapted to configure bandwidth in the memory device upon reset of the memory device.

11. The apparatus of claim 6, wherein the switch is adapted to dynamically configure bandwidth in the memory device during operation.

12. A system, comprising:
    a stack of memory dies, including a number of memory vaults;
    a logic die stacked with the stack of memory dies;
    a switch selectably coupled to the number of memory vaults to dynamically select a number of vaults that operate synchronously for a single memory request during operation of the apparatus.

13. The system of claim 12, further including a processor coupled to the memory device.

14. The system of claim 13, wherein the processor is coupled to the memory device through a system bus.

15. The system of claim 13, further including a display device coupled to the processor.

16. The system of claim 12, wherein the switch is adapted to configure bandwidth in the memory device upon reset of the memory device.

17. The system of claim 12, wherein the switch is adapted to configure bandwidth in the memory device upon startup of the memory device.

* * * * *